(12) United States Patent
Michioka

(10) Patent No.: US 11,264,988 B2
(45) Date of Patent: Mar. 1, 2022

(54) CODE SHIFT CALCULATION CIRCUIT AND METHOD FOR CALCULATING CODE SHIFT VALUE

(71) Applicant: Winbond Electronics Corp., Taichung (TW)

(72) Inventor: Yoshihisa Michioka, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/231,012

(22) Filed: Apr. 15, 2021

(65) Prior Publication Data

US 2021/0367595 A1 Nov. 25, 2021

(30) Foreign Application Priority Data

May 19, 2020 (JP) .............................. JP2020-087117

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01)

(58) Field of Classification Search
None
See application file for complete search history.

(56) References Cited

U.S. PATENT DOCUMENTS 9,825,631 B1 11/2017 Cho et al.
10,192,607 B2 1/2019 Wang
10,607,667 B2 3/2020 Kim et al.
10,917,093 B1* 2/2021 He ........................... G11C 7/04
2008/0278192 A1* 11/2008 Lee ..................... H03K 19/0005
326/30
2016/0134285 A1* 5/2016 Ha ...................... H03K 19/0005
326/30
2017/0147019 A1* 5/2017 Kim .................. G11C 29/56012
2021/0149423 A1* 5/2021 He ..................... H03K 19/0005

FOREIGN PATENT DOCUMENTS

CN 107393577 6/2018
TW I653637 3/2019

OTHER PUBLICATIONS

"Office Action of Taiwan Counterpart Application", dated Mar. 3, 2021, p. 1-p. 3.

* cited by examiner

*Primary Examiner* — Jany Richardson
(74) *Attorney, Agent, or Firm* — JCIPRNET

(57) ABSTRACT

A code shift calculation circuit is provided. A first operation circuit of the code shift calculation circuit generates a first output value according to a temperature difference and a first change rate of a driving strength code to temperature. The temperature difference is a difference between a previous temperature when getting a previous ZQ command and a current temperature when getting a current ZQ command. A second operation circuit generates a second output value according to a voltage difference and a second change rate of the driving strength code to voltage. The voltage difference is a difference between a previous working voltage when getting the previous ZQ command and a current working voltage when getting the current ZQ command. A third operation circuit sums up the first output value and the second output value to generate a shift value, thereby adjusting the driving strength code calibrated by ZQ calibration.

14 Claims, 5 Drawing Sheets

CODE SHIFT CALCULATION CIRCUIT AND METHOD FOR CALCULATING CODE SHIFT VALUE

CROSS-REFERENCE TO RELATED APPLICATION

This application claims the priority benefit of Japan application serial no. 2020-087117, filed on May 19, 2020. The entirety of the above-mentioned patent application is hereby incorporated by reference herein and made a part of this specification.

BACKGROUND

Technical Field

The invention relates to ZQ calibration, and particularly relates to adjusting of a driving strength code calibrated by ZQ calibration according to a voltage change and a temperature change.

Description of Related Art

Along with increase of operation speed of electronic equipment, a swing width of a signal transmitted between semiconductor storage devices within the electronic device is decreased to minimize a delay time taken for transmitting the signal. However, along with decrease of the swing width, signal transmission is more affected by external noise, and signal reflection at an interface end is increased due to impedance mismatch. The impedance mismatch is caused by changes in manufacturing process, supply voltage and process-voltage-temperature (PVT). The impedance mismatch results in distortion of a signal output from the semiconductor memory device, and may cause a set up/hold failure or signal level misjudgment in the corresponding semiconductor memory device that receives the distorted signal. In order to match an impedance of a transmission line with an output impedance of an output circuit, an output impedance of the semiconductor memory device must be adjusted to match the impedance of the transmission line.

A ZQ calibration circuit is used to adjust the output impedance of the semiconductor memory device, and provides a ZQ pin to serve as a ZQ calibration terminal in the semiconductor memory device. An external ZQ calibration command, such as a ZQ calibration short (ZQCS) command is input to the ZQ pin. When the external ZQ calibration command is input, a ZQ calibration operation is performed within a period defined by this command to use a generated code to change a resistance value of an output driver. In order to improve resistance accuracy of the output driver after the ZQ calibration, a method of improving resolution may be adopted, i.e., a method of adding code is adopted. However, since the period defined by the ZQCS command is short, if the resolution is increased under the premise of increasing a width of code that may be moved by the ZQCS command, it probably results in a risk that the signal transmission does not conform to a specification (i.e., the period defined by the ZQCS command). Comparatively, if the resolution is increased under the premise of not increasing the width of the code that may be moved by the ZQCS command, it is difficult to eliminate the change in the output impedance caused by a temperature change or a voltage change.

Therefore, other solutions are needed to increase the resolution under the premise of not increasing the width of the code that may be moved by the ZQCS command, and eliminate the change in the output impedance caused by the temperature change or the voltage change, i.e., deviation of a driving strength code caused by the temperature change or the voltage change.

SUMMARY

The invention is directed to a code shift calculation circuit and a method for calculating a code shift value, which are adapted to eliminate deviation of a driving strength code caused by a temperature change or a voltage change by shifting the driving strength code calibrated by ZQ calibration.

The invention provides a code shift calculation circuit to generate a shift value to adjust a driving strength code calibrated by ZQ calibration. The code shift calculation circuit includes a first operation circuit, a second operation circuit and a third operation circuit. The first operation circuit generates a first output value according to a temperature difference and a first change rate of the driving strength code to temperature, wherein the temperature difference is a difference between a previous temperature when getting a previous ZQ command and a current temperature when getting a current ZQ command. The second operation circuit generates a second output value according to a voltage difference and a second change rate of the driving strength code to voltage, wherein the voltage difference is a difference between a previous working voltage when getting the previous ZQ command and a current working voltage when getting the current ZQ command. The third operation circuit sums up the first output value and the second output value to generate the shift value, so as to adjust the driving strength code calibrated by ZQ calibration.

The invention provides a method for calculating a code shift value, which is configured to generate a shift value to adjust a driving strength code calibrated by ZQ calibration. The method includes following steps. A first output value is generated according to a temperature difference and a first change rate of the driving strength code to temperature, wherein the temperature difference is a difference between a previous temperature when getting a previous ZQ command and a current temperature when getting a current ZQ command. A second output value is generated according to a voltage difference and a second change rate of the driving strength code to voltage, wherein the voltage difference is a difference between a previous working voltage when getting the previous ZQ command and a current working voltage when getting the current ZQ command. The first output value and the second output value are summed up to generate the shift value, so as to adjust the driving strength code.

Based on the above description, in the invention, the code shift value is generated according to the temperature difference and the voltage difference of the working voltages, so as to adjust the driving strength code calibrated by ZQ calibration. Therefore, the invention may eliminate the deviation of the driving strength code caused by temperature change or voltage change at the same time under the premise of improving resolution.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
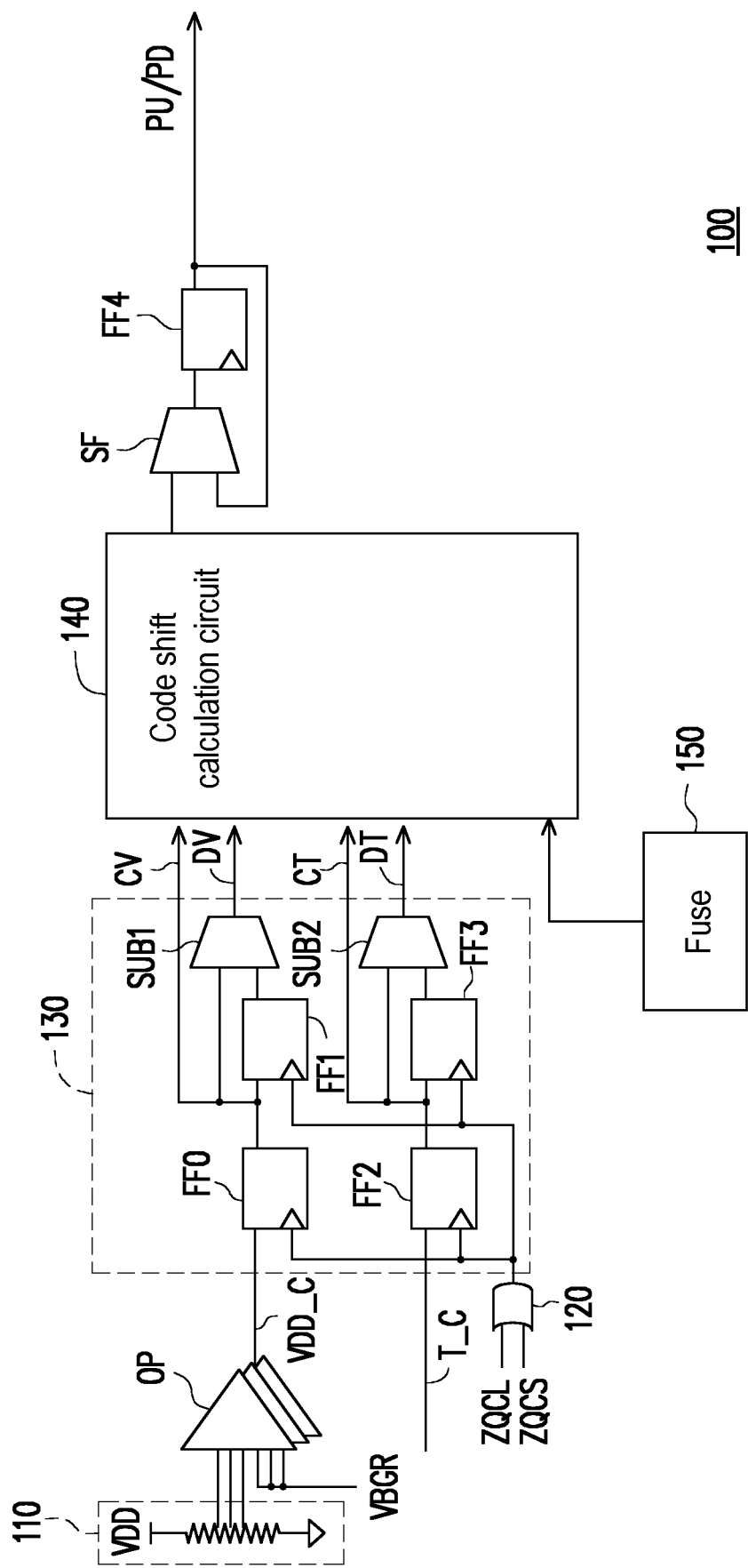
FIG. 1 is a block schematic diagram of a code shift calculation device of the invention.

FIG. 1 is a block schematic diagram of a code shift calculation device of the invention. Referring to FIG. 1, a code shift calculation device 100 includes a resistance voltage divider circuit 110, an amplifier OP, an OR gate 120, a temperature change and voltage change calculation circuit 130, a code shift calculation circuit 140, a fuse 150, a shifter SF, and a flip-flop FF4. The resistance voltage divider circuit 110 is configured to provide a divided voltage of a working voltage VDD. The amplifier OP receives the divided voltage of the working voltage VDD and a reference voltage VBGR to output a voltage code VDD_C representing a voltage value of the working voltage VDD.

The temperature change and voltage change calculation circuit 130 receives the voltage code VDD_C and a temperature code T_C representing a temperature value. The temperature change and voltage change calculation circuit 130 includes flip-flops FF0-FF3 and subtractors SUB1 and SUB2. The flip-flops FF0-FF3 are triggered by a ZQCS command or a ZQCL command. For example, at a time point of a current rising edge of the ZQCS command, the flip-flop FF0 outputs the voltage code VDD_C corresponding to such time point to serve as a current voltage CV, and the flip-flop FF1 outputs the voltage code VDD_C corresponding to a time point of a previous rising edge of the ZQCS command to serve as a previous voltage. The subtractor SUB1 calculates a voltage change amount DV between the time point of the previous rising edge and the time point of the current rising edge according to the current voltage CV and the previous voltage code. Similarly, the flip-flop FF2 outputs a current temperature CT, the flip-flop FF3 outputs a previous temperature, and the subtractor SUB2 is used to generate a temperature change amount DT.

The code shift calculation circuit 140 may calculate a shift value for adjusting a driving strength code calibrated by ZQ calibration according to the current voltage CV, the voltage change amount DV, the current temperature CT, and the temperature change amount DT. In this way, in the present invention, the driving strength code calibrated by ZQ calibration may be adjusted (or shifted) in response to a temperature change or a voltage change. It should be noted that a change rate of the driving strength code required for code shift calculation to temperature at a high/low voltage, and a change rate of the driving strength code to voltage at a high/low temperature may be stored in advance through the fuse 150. However, the invention is not limited to store the aforementioned change rates only with the fuse, and any storage device with a storage function (such as a memory circuit) is considered to be within a protection scope of the invention.

The shifter SF receives the shift value calculated by the code shift calculation circuit 140 and a pull-up/pull-down signal PU/PD. The shifter SF adjusts the pull-up/pull-down signal PU/PD according to the shift value, and outputs the adjusted pull-up/pull-down signal PU/PD to the flip-flop FF4. The flip-flop FF4 outputs the adjusted pull-up/pull-down signal PU/PD (a code form) after being triggered. In an embodiment, the shifter SF may be implemented by an adder.

Figure 2A:
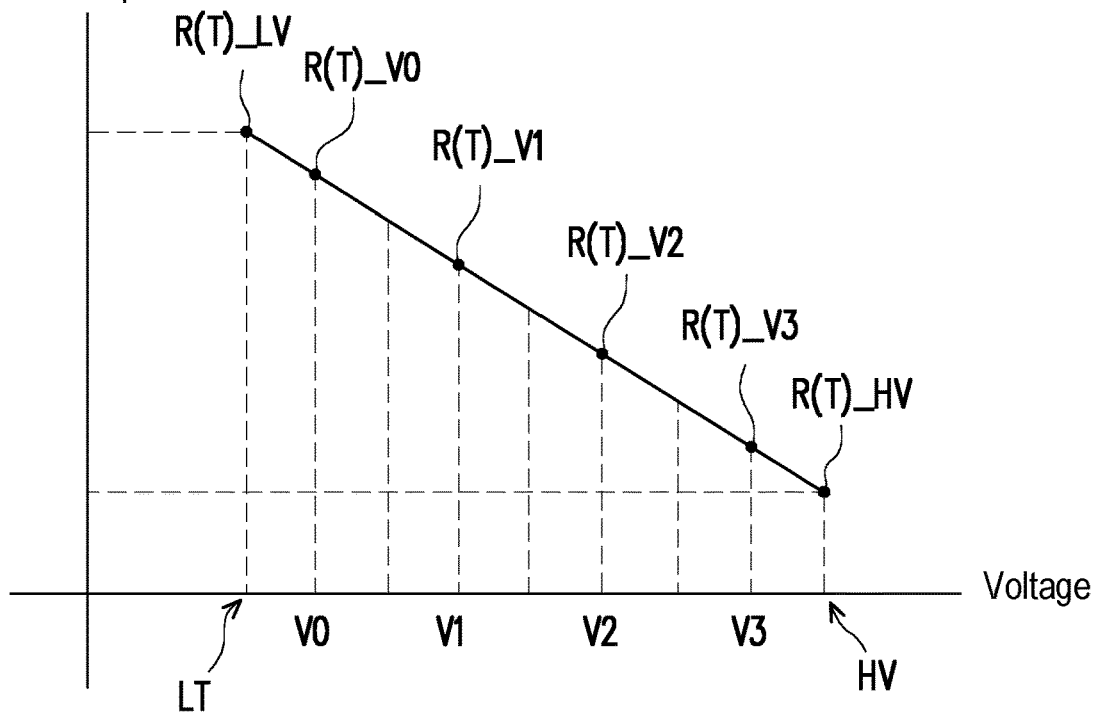
FIG. 2A is a curve diagram showing a relationship between a change rate of code to temperature with respect to voltage.

FIG. 2A is a curve diagram showing a relationship between a change rate of code to temperature with respect to voltage. Referring to FIG. 2A, R(T)_LV represents a change rate of code to temperature under a low voltage LV, R(T)_HV represents the change rate of code to temperature under a high voltage HV. The above "high voltage" and "low voltage" may be two extreme values of a normal working voltage range. Values of the change rate R(T)_LV and the change rate R(T)_HV may be obtained through experiment and may be stored to the fuse 150 in advance. The code shift calculation circuit 140 may assume that the change rate of code to temperature is linear with respect to the change of voltage, such that the change rate of code to voltage (for example, any one of change rates R(T)_V0 to R(T)_V3) is calculated according to the values of the received change rate R(T)_LV, change rate R(T)_HV and the current voltage CV (for example, any one of voltages V0-V3). It should be noted that although only the voltages V0-V3 are illustrated in FIG. 2A, the invention is not limited thereto. In other embodiments, more voltage values may be divided between the voltage LV and the voltage HV.

Figure 2B:
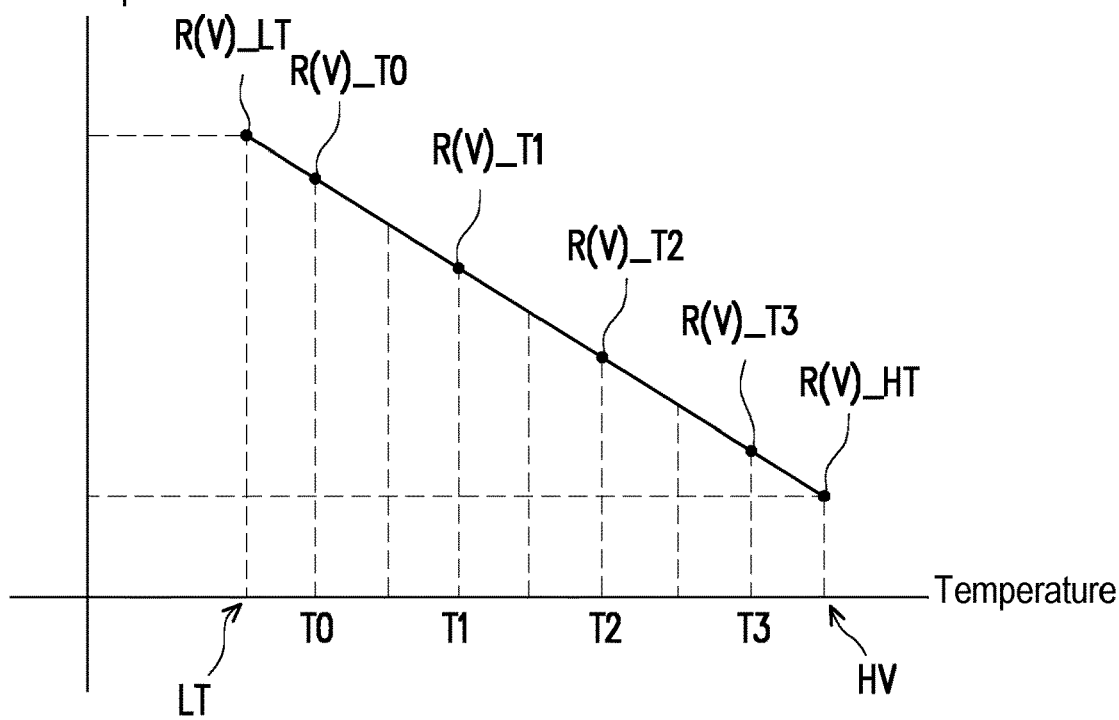
FIG. 2B is a curve diagram showing a relationship between a change rate of code to voltage with respect to temperature.

FIG. 2B is a curve diagram showing a relationship between a change rate of code to voltage with respect to temperature. Referring to FIG. 2B, R(V)_LT represents a change rate of code to voltage under a low temperature LT, R(V)_HV represents the change rate of code to voltage under a high temperature HT. The above "high temperature" and "low temperature" may be two extreme values of a normal working temperature range. Values of the change rate R(V)_LT and the change rate R(V)_HT may be obtained through experiment and may be stored to the fuse 150 in advance. The code shift calculation circuit 140 may assume that the change rate of code to voltage is linear with respect to the change of temperature, such that the change rate of code to voltage (for example, any one of change rates R(V)_T0 to R(V)_T3) is calculated according to the values of the received change rate R(V)_LT, change rate R(V)_HT and the current temperature CT (for example, any one of temperatures T0-T3). It should be noted that although only the temperatures T0-T3 are illustrated in FIG. 2B, the invention is not limited thereto. In other embodiments, more temperature values may be divided between the low temperature LT and the high temperature HT.

Figure 3:
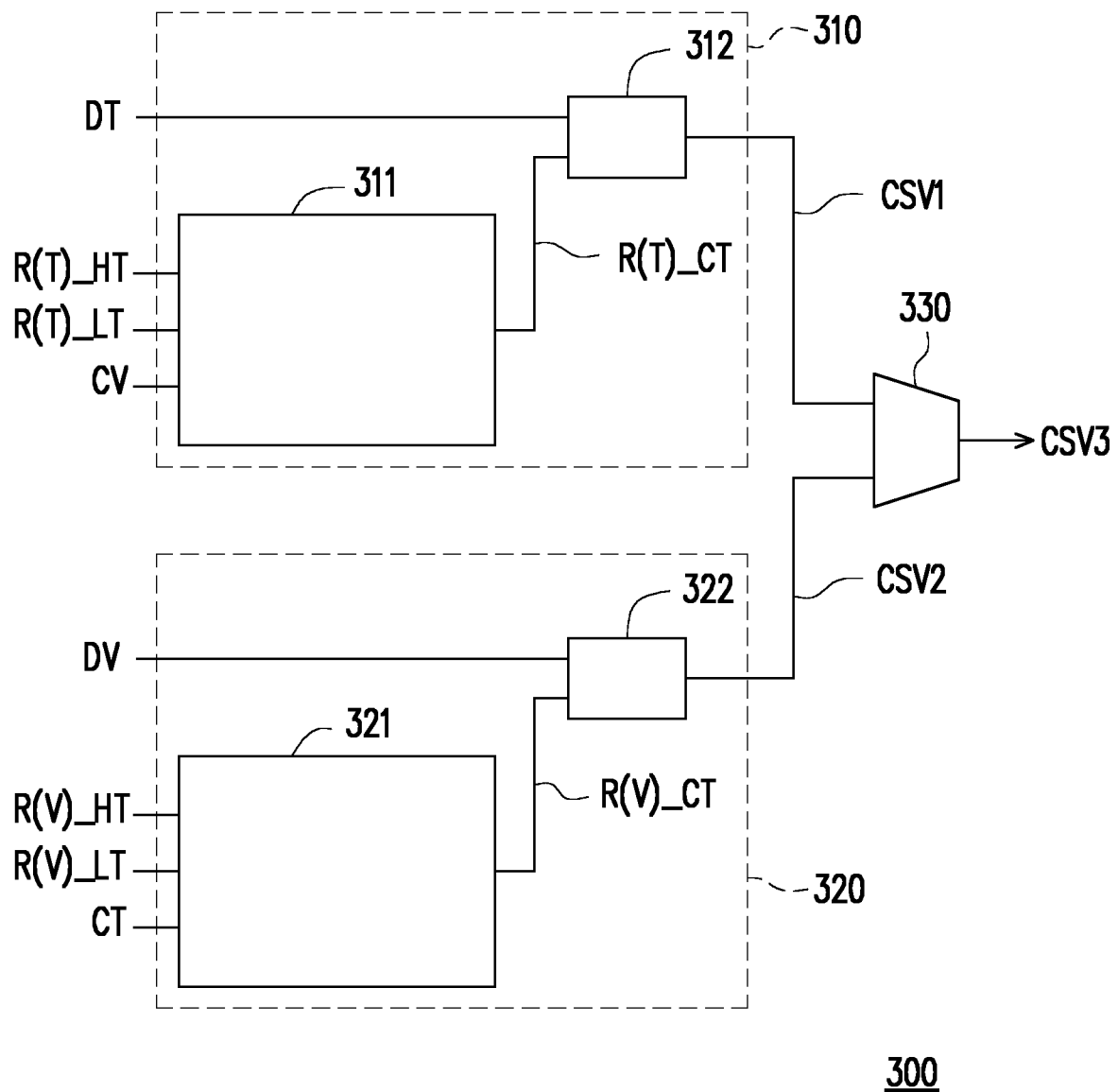
FIG. 3 is a block schematic diagram of a code shift calculation circuit of the invention.

FIG. 3 is a block schematic diagram of a code shift calculation circuit of the invention. Referring to FIG. 3, the code shift calculation circuit 300 includes a first operation circuit 310, a second operation circuit 320, and an adder 330. The first operation circuit 310 includes a ratio calculation circuit 311 and a multiplier 312. The ratio calculation circuit 311 receives the change rate R(T)_HV, the change rate R(T)_LV, and the current voltage CV. The ratio calculation circuit 311 calculates the change rate R(T)_CV of code to temperature corresponding to the current voltage CV according to the above three values to serve as a first change rate. The multiplier 312 receives the change rate R(T)_CV and the temperature change amount DT, and calculates a product of the change rate R(T)_CV and the temperature change amount DT to serve as a first output value CSV1.

The second operation circuit 320 includes a ratio calculation circuit 321 and a multiplier 322. The ratio calculation circuit 321 receives the change rate R(V)_HT, the change rate R(V)_LT, and the current temperature CT. The ratio calculation circuit 321 calculates the change rate R(V)_CT of code to voltage corresponding to the current temperature CT according to the above three values to serve as a second change rate. The multiplier 322 receives the change rate R(V)_CT and the voltage change amount DV, and calculates a product of the change rate R(V)_CT and the voltage change amount DV to serve as a second output value CSV2. Finally, the adder 330 is used to add the first output value CSV1 and the second output value CSV2 to obtain a shift value CSV3 for adjusting the driving strength code.

Figure 4:
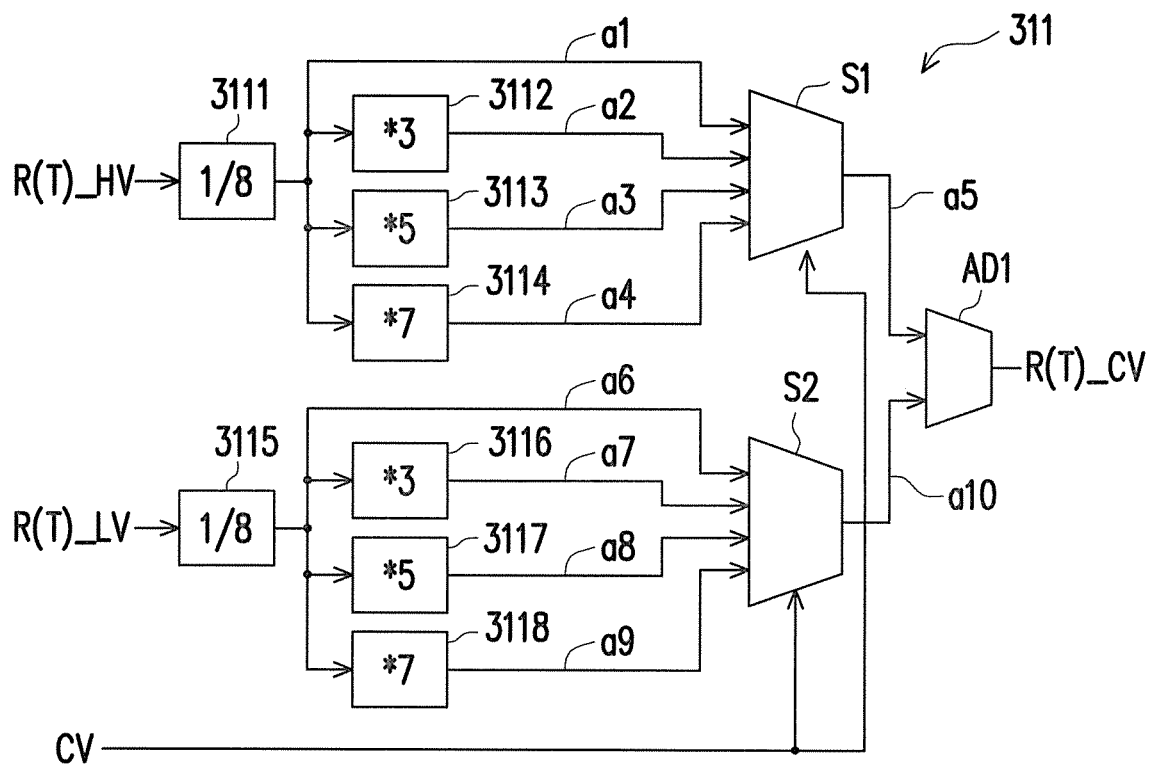
FIG. 4 is a block schematic diagram of a ratio calculation circuit 311 according to an embodiment of the invention.

FIG. 4 is a block schematic diagram of the ratio calculation circuit 311 according to an embodiment of the invention. Referring to FIG. 4, in the embodiment, the ratio calculation circuit 311 includes dividers 3111 and 3115, multipliers 3112-3114 and 3116-3118, multiplexers S1 and S2, and an adder AD1. The divider 3111 receives the change rate R(T)_HV, and divides the change rate R(T)_HV by 8 to obtain a value a1. The multipliers 3112-3114 receive the value a1, and respectively multiply the value a1 by 3, 5 and 7 to obtain values a2-a4. The multiplexer S1 is used to select one value corresponding to the current voltage CV from the values a1 to a4 according to the current voltage CV for output, and the output value is referred to as a value a5.

Similarly, the divider 3115 receives the change rate R(T)_LV, and divides the change rate R(T)_LV by 8 to obtain a value a6. The multipliers 3116-3118 receive the value a6, and respectively multiply the value a6 by 3, 5 and 7 to obtain values a7-a9. The multiplexer S2 is used to select one value corresponding to the current voltage CV from the values a6 to a9 according to the current voltage CV for output, and the output value is referred to as a value a10. The adder AD1 is used to add the value a5 and the value a10 to obtain the change rate R(T)_CV of code to temperature corresponding to the current voltage CV.

Referring to FIG. 2A and FIG. 4, when a value of the current voltage CV is equal to a value of a voltage V0, the multiplexers S1 and S2 respectively select the value a1 and the value a6 for output. When the value of the current voltage CV is equal to a value of a voltage V1, the multiplexers S1 and S2 respectively select the value a2 and the value a7 for output. When the value of the current voltage CV is equal to a value of a voltage V2, the multiplexers S1 and S2 respectively select the value a3 and the value a8 for output. When the value of the current voltage CV is equal to a value of a voltage V3, the multiplexers S1 and S2 respectively select the value a4 and the value a9 for output.

Figure 5:
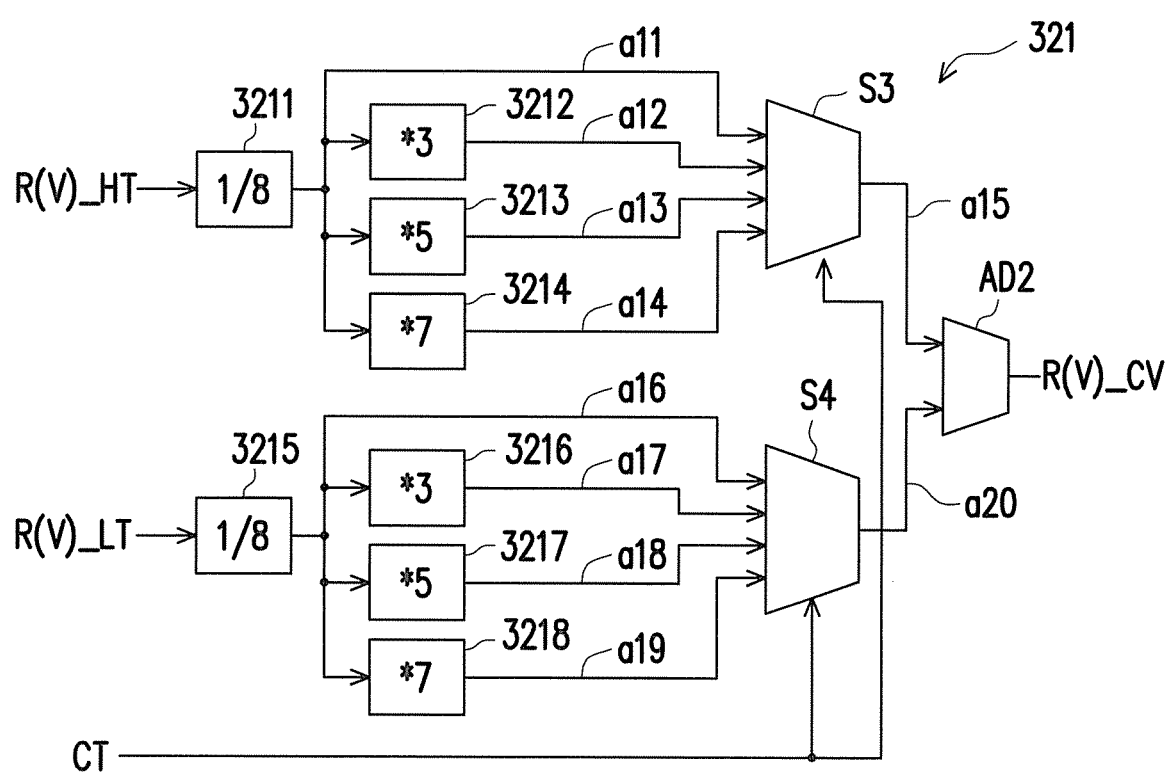
FIG. 5 is a block schematic diagram of a ratio calculation circuit 321 according to an embodiment of the invention.

FIG. 5 is a block schematic diagram of the ratio calculation circuit 321 according to an embodiment of the invention. Referring to FIG. 5, in the embodiment, the ratio calculation circuit 321 includes dividers 3211 and 3215, multipliers 3212-3214 and 3216-3218, multiplexers S3 and S4, and an adder AD2. The divider 3211 receives the change rate R(V)_HT, and divides the change rate R(V)_HT by 8 to obtain a value a11. The multipliers 3212-3214 receive the value a11, and respectively multiply the value a11 by 3, 5 and 7 to obtain values a12-a14. The multiplexer S3 is used to select one value corresponding to the current temperature CT from the values a11 to a14 according to the current temperature CT for output, and the output value is referred to as a value a15.

Similarly, the divider 3215 receives the change rate R(V)_LT, and divides the change rate R(V)_LT by 8 to obtain a value a16. The multipliers 3216-3218 receive the value a16, and respectively multiply the value a16 by 3, 5 and 7 to obtain values a17-a19. The multiplexer S4 is used to select one value corresponding to the current temperature CT from the values a16 to a19 according to the current voltage CV for output, and the output value is referred to as a value a20. The adder AD2 is used to add the value a15 and the value a20 to obtain the chance rate R(V)_CT of code to voltage corresponding to the current temperature CT.

Referring to FIG. 2B and FIG. 5, when a value of the current temperature CT is equal to a value of a temperature T0, the multiplexers S3 and S4 respectively select the value a11 and the value a16 for output. When the value of the current temperature CT is equal to a value of a temperature T1, the multiplexers S3 and S4 respectively select the value a12 and the value a17 for output. When the value of the current temperature CT is equal to a value of a temperature T2, the multiplexers S3 and S4 respectively select the value a13 and the value a18 for output. When the value of the current temperature CT is equal to a value of a temperature T3, the multiplexers S3 and S4 respectively select the value a14 and the value a19 for output.

It should be noted that, the numbers and corresponding operations of the multipliers and the dividers in FIG. 4 and FIG. 5 are related to settings of ranges of the high/low temperature, and the high/low voltage, and distinguishing fineness of the above ranges. In other embodiments, more multipliers and dividers corresponding to different operations may be used to obtain more precise calculation results.

Figure 6:
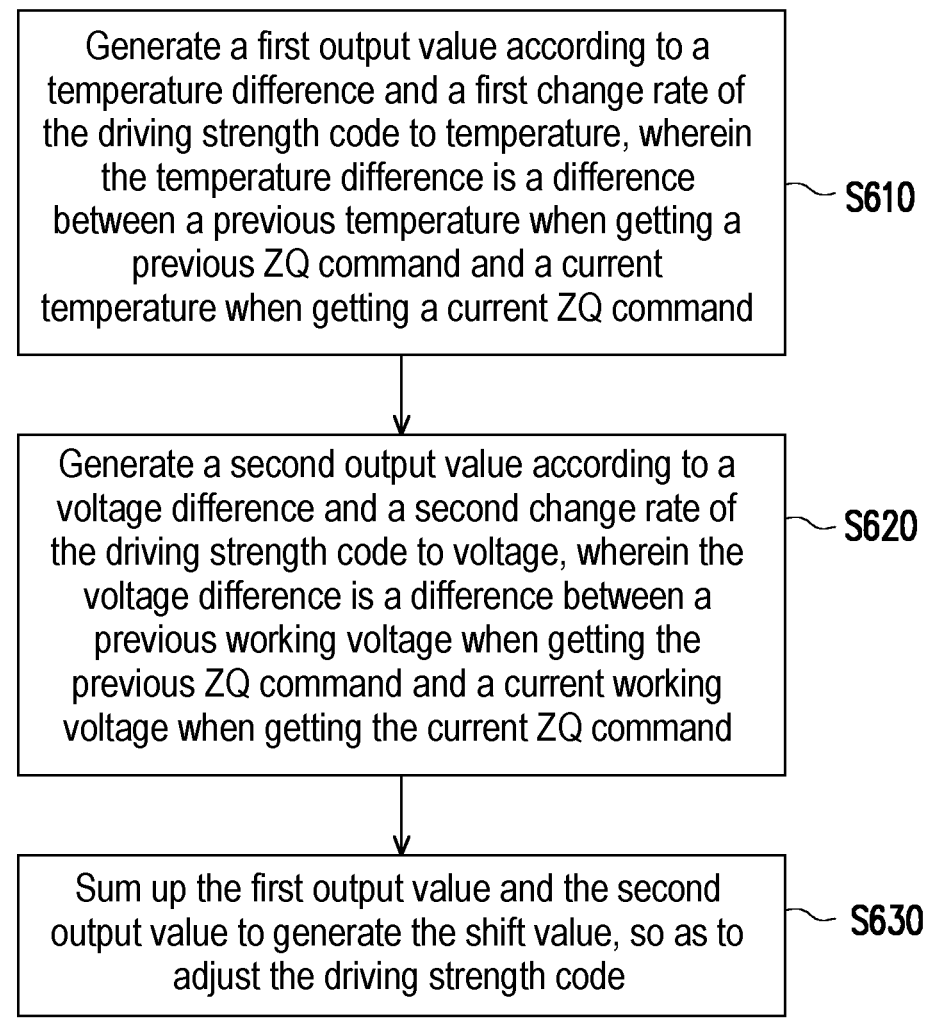
FIG. 6 is a flowchart illustrating a method for calculating a code shift value according to the invention.

FIG. 6 is a flowchart illustrating a method for calculating a code shift value according to the invention. Referring to FIG. 3 and FIG. 6, in step S610, the first output value CSV1 is generated according to a temperature difference (i.e. the temperature change amount DT) and a first change rate (i.e. the change rate R(T)_CV) of the driving strength code to temperature, where the temperature change amount DT is a difference between a previous temperature when getting a previous ZQ command and a current temperature when getting a current ZQ command. In step S620, the second output value CSV2 is generated according to a voltage difference (the voltage change amount DV) and a second change rate (i.e. the change rate R(V)_CT) of the driving strength code to voltage, where the voltage change amount DV is a difference between a previous working voltage when getting the previous ZQ command and a current working voltage when getting the current ZQ command. In step S630, the first output value CSV1 and the second output value CSV2 are summed up to generate the shift value CSV3, so as to adjust the driving strength code.

In summary, in the invention, the code shift value may be generated according to the temperature difference and the voltage difference of the working voltages, so as to adjust the driving strength code calibrated by ZQ calibration. Therefore, the invention may eliminate the deviation of the driving strength code caused by temperature change or voltage change at the same time under the premise of improving resolution.

What is claimed is:

1. A code shift calculation circuit, configured to generate a shift value to adjust a driving strength code calibrated by ZQ calibration, comprising:

a first operation circuit, configured to generate a first output value according to a temperature difference and a first change rate of the driving strength code to temperature, wherein the temperature difference is a difference between a previous temperature when getting a previous ZQ command and a current temperature when getting a current ZQ command;

a second operation circuit, configured to generate a second output value according to a voltage difference and a second change rate of the driving strength code to voltage, wherein the voltage difference is a difference between a previous working voltage when getting the previous ZQ command and a current working voltage when getting the current ZQ command; and a third operation circuit, configured to sum up the first output value and the second output value to generate the shift value, thereby adjusting the driving strength code.

2. The code shift calculation circuit as claimed in claim 1, wherein the first operation circuit is further configured to calculate a product of the temperature difference and the first change rate to obtain the first output value, and the second operation circuit is further configured to calculate a product of the voltage difference and the second change rate to obtain the second output value.

3. The code shift calculation circuit as claimed in claim 1, wherein the first operation circuit is further configured to:
calculate the first change rate according to the current working voltage, a first extreme change rate of the driving strength code to temperature under a first extreme working voltage, and a second extreme change rate of the driving strength code to temperature under a second extreme working voltage; and
the second operation circuit is further configured to:
calculate the second change rate according to the current temperature, a third extreme change rate of the driving strength code to voltage under a first extreme temperature, and a fourth extreme change rate of the driving strength code to voltage under a second extreme temperature.

4. The code shift calculation circuit as claimed in claim 3, wherein the first operation circuit is further configured to:
sum up the first extreme change rate of a first ratio and the second extreme change rate of a second ratio to generate the first change rate, wherein the first ratio and the second ratio are determined according to the current working voltage; and
the second operation circuit is further configured to:
sum up the third extreme change rate of a third ratio and the fourth extreme change rate of a fourth ratio to generate the second change rate, wherein the third ratio and the fourth ratio are determined according to the current temperature.

5. The code shift calculation circuit as claimed in claim 4, wherein the first operation circuit is further configured to:
select the first extreme change rate of the first ratio from the first extreme change rate of a plurality of different ratios according to the current working voltage, and select the second extreme change rate of the second ratio from the second extreme change rate of the plurality of different ratios according to the current working voltage; and
the second operation circuit is further configured to:
select the third extreme change rate of the third ratio from the third extreme change rate of the plurality of different ratios according to the current temperature, and select the fourth extreme change rate of the fourth ratio from the fourth extreme change rate of the plurality of different ratios according to the current temperature.

6. The code shift calculation circuit as claimed in claim 5, wherein the plurality of different ratios comprise (⅛), (⅝), and (⅞).

7. The code shift calculation circuit as claimed in claim 3, wherein the first operation circuit comprises:
a first multiplexer, configured to select to output the first extreme change rate of a first ratio from the first extreme change rate of a plurality of different ratios according to the current working voltage;
a second multiplexer, configured to select to output the second extreme change rate of a second ratio from the second extreme change rate of the plurality of different ratios according to the current working voltage; and
a first adder, configured to sum up the first extreme change rate of the first ratio and the second extreme change rate of the second ratio to obtain the first change rate;
wherein the second operation circuit comprises:
a third multiplexer, configured to select to output the third extreme change rate of a third ratio from the third extreme change rate of the plurality of different ratios according to the current temperature;
a fourth multiplexer, configured to select to output the fourth extreme change rate of a fourth ratio from the fourth extreme change rate of the plurality of different ratios according to the current temperature; and
a second adder, configured to sum up the third extreme change rate of the third ratio and the fourth extreme change rate of the fourth ratio to obtain the second change rate.

8. The code shift calculation circuit as claimed in claim 7, wherein the plurality of different ratios comprise (⅛), (⅝), and (⅞).

9. A method for calculating a code shift value, configured to generate a shift value to adjust a driving strength code calibrated by ZQ calibration, the method comprising:
generating a first output value according to a temperature difference and a first change rate of the driving strength code to temperature, wherein the temperature difference is a difference between a previous temperature when getting a previous ZQ command and a current temperature when getting a current ZQ command;
generating a second output value according to a voltage difference and a second change rate of the driving strength code to voltage, wherein the voltage difference is a difference between a previous working voltage when getting the previous ZQ command and a current working voltage when getting the current ZQ command; and
summing up the first output value and the second output value to generate the shift value, thereby adjusting the driving strength code.

10. The method for calculating the code shift value as claimed in claim 9, further comprising:
calculating a product of the temperature difference and the first change rate to obtain the first output value; and
calculating a product of the voltage difference and the second change rate to obtain the second output value.

11. The method for calculating the code shift value as claimed in claim 9, further comprising:
calculating the first change rate according to the current working voltage, a first extreme change rate of the driving strength code to temperature under a first extreme working voltage, and a second extreme change rate of the driving strength code to temperature under a second extreme working voltage; and calculating the second change rate according to the current temperature, a third extreme change rate of the driving strength code to voltage under a first extreme temperature, and a fourth extreme change rate of the driving strength code to voltage under a second extreme temperature.

12. The method for calculating the code shift value as claimed in claim 11, further comprising:

summing up the first extreme change rate of a first ratio and the second extreme change rate of a second ratio to generate the first change rate, wherein the first ratio and the second ratio are determined according to the current working voltage; and summing up the third extreme change rate of a third ratio and the fourth extreme change rate of a fourth ratio to generate the second change rate, wherein the third ratio and the fourth ratio are determined according to the current temperature.

13. The method for calculating the code shift value as claimed in claim 12, further comprising:

selecting the first extreme change rate of the first ratio from the first extreme change rate of a plurality of different ratios according to the current working voltage, and selecting the second extreme change rate of the second ratio from the second extreme change rate of the plurality of different ratios according to the current working voltage; and selecting the third extreme change rate of the third ratio from the third extreme change rate of the plurality of different ratios according to the current temperature, and selecting the fourth extreme change rate of the fourth ratio from the fourth extreme change rate of the plurality of different ratios according to the current temperature.

14. The method for calculating the code shift value as claimed in claim 13, wherein the plurality of different ratios comprise ($\frac{1}{8}$), ($\frac{5}{8}$), and ($\frac{7}{8}$).

* * * * *